United States Patent [19]

Itoh et al.

[11] 3,991,283
[45] Nov. 9, 1976

[54] MULTICHANNEL RECORD DISC REPRODUCING SYSTEM

[75] Inventors: Yasuo Itoh, Tokyo; Nobuaki Takahashi, Yamato; Masao Kasuga, Sagamihara, all of Japan

[73] Assignee: Victor Company of Japan, Limited, Yokohama, Japan

[22] Filed: Sept. 12, 1975

[21] Appl. No.: 612,640

Related U.S. Application Data

[63] Continuation-in-part of Ser. No. 471,769, May 20, 1974, abandoned.

[30] Foreign Application Priority Data

May 21, 1973 Japan.............................. 48-56473
May 24, 1973 Japan.............................. 48-57132

[52] U.S. Cl. .................... 179/100.4 ST; 179/1 GQ; 179/100.1 TD
[51] Int. Cl.²....................... G11B 3/00; G11B 3/74
[58] Field of Search.......... 179/100.4 ST, 100.1 TD, 179/1 GQ, 15 BT

[56] References Cited

UNITED STATES PATENTS

| | | | |
|---|---|---|---|
| 3,564,434 | 2/1971 | Camenzino et al. | 179/100.4 |
| 3,686,471 | 8/1972 | Takahashi | 179/100.4 |
| 3,839,602 | 10/1974 | Takahashi | 179/100.4 |
| 3,843,850 | 10/1974 | Takahashi et al. | 179/100.4 |

*Primary Examiner*—Vincent P. Canney

[57] ABSTRACT

A multichannel record disc reproducing system comprises a circuit for demodulating an angle-modulated wave picked up from a multichannel record disc. A circuit detects abnormal phenomena of the angle-modulated wave, whereupon an expansion circuit accomplishes a variable control operation. A middle frequency band and/or a high frequency band component of the demodulated signal is attenuated in accordance with the level thereof. A circuit is operated in response to the output of the detection circuit to stop a variable expansion control operation of the expansion circuit and imparts a specific attenuation characteristic to a signal passing through the expansion circuit.

11 Claims, 8 Drawing Figures

MULTICHANNEL RECORD DISC REPRODUCING SYSTEM

This is a continuation-in-part application of Ser. No. 471,769, filed on May 20, 1974, and now abandoned.

BACKGROUND OF THE INVENTION

This invention relates generally to a multichannel record disc reproducing system and apparatus. More particularly, it relates to a system and apparatus for reproducing a multichannel record disc while suppressing the frequency band wherein the noise components are predominatingly distributed.

A discrete four-channel record disc system previously was proposed by one of the present applicants, Nobuaki Takahashi, and was patented in the United States as U.S. Pat. No. 3,686,471. A direct wave of a sum signal of a pair derived from two channels and an angle-modulated wave obtained by angle modulating a 30 KHz carrier wave responsive to the difference signal of a pair of two channels are multiplexed and recorded on the respective side wall of the disc sound groove.

In general, abnormal noises generated at the time of reproducing such a multichannel record disc can be classified broadly into the following two kinds, depending on the cause of the noise.

1. Abnormal noise is caused by wear upon the sound groove of the disc, whereby the carrier level of the angle-modulated wave drops greatly, and the noise level becomes higher than the carrier level.

2. Abnormal noise is caused by the nonlinearity of the mechanical systems of the cutter in the recording system, the pickup in the reproducing system, and the sound groove of the record disc, when the level of the direct wave sum signal is extremely high, particularly when the level of the high-frequency component is high.

The present applicants have previously proposed various systems for preventing the reproduction and generation of the above enumerated noises in demodulated signals. For example, if an angle-modulated wave is partially lacking, it is equivalent to deviation of the angle-modulated wave responsive to a low frequency. For this reason, one proposed system detects this frequency deviation and applies muting to shut off the signal. Another system detects the above mentioned deviation toward the low frequency, and, in response thereto, the loop gain of a phase-locked loop is decreased, thereby to constrict the lock range and prevent the phase-locked loop from locking to the noise component.

However, in accordance with these prior proposed systems, the suppressing of impulse noises (arising from causes such as scratches and dust in the disc sound groove) is effectively achieved with no great problems. However, if the level of a sum signal is high, particularly in a high frequency band, the angle-modulated wave signal is continuously disturbed. Then, the application of one of the above mentioned proposed systems gives rise to an attenuation or cutting off of the difference signal component, continuously for a certain time. High-fidelity reproducing cannot be carried out. Furthermore, these proposed systems are also accompanied by other problems such as unsatisfactory sound source localization.

SUMMARY OF THE INVENTION

Accordingly, it is a general object of the present invention to provide a new and useful multichannel record disc reproducing system and apparatus in which the above described difficulties have been overcome.

A specific object of the invention is to provide a multichannel record disc reproducing system and apparatus adapted to carry out reproduction by attenuating the level of a predetermined frequency band in which noise components are predominatingly distributed in a demodulated signal. This attenuation occurs at the time when a noise component is present.

Still another object of the invention is to provide a system for suppressing noise by utilizing an expansion circuit of a compression and expansion system, thereby accomplishing multichannel record disc reproduction.

Other objects and further features of the invention will be apparent from the following detailed description when read in conjunction with the accompanying drawings.

DETAILED DESCRIPTION

Figure 1:
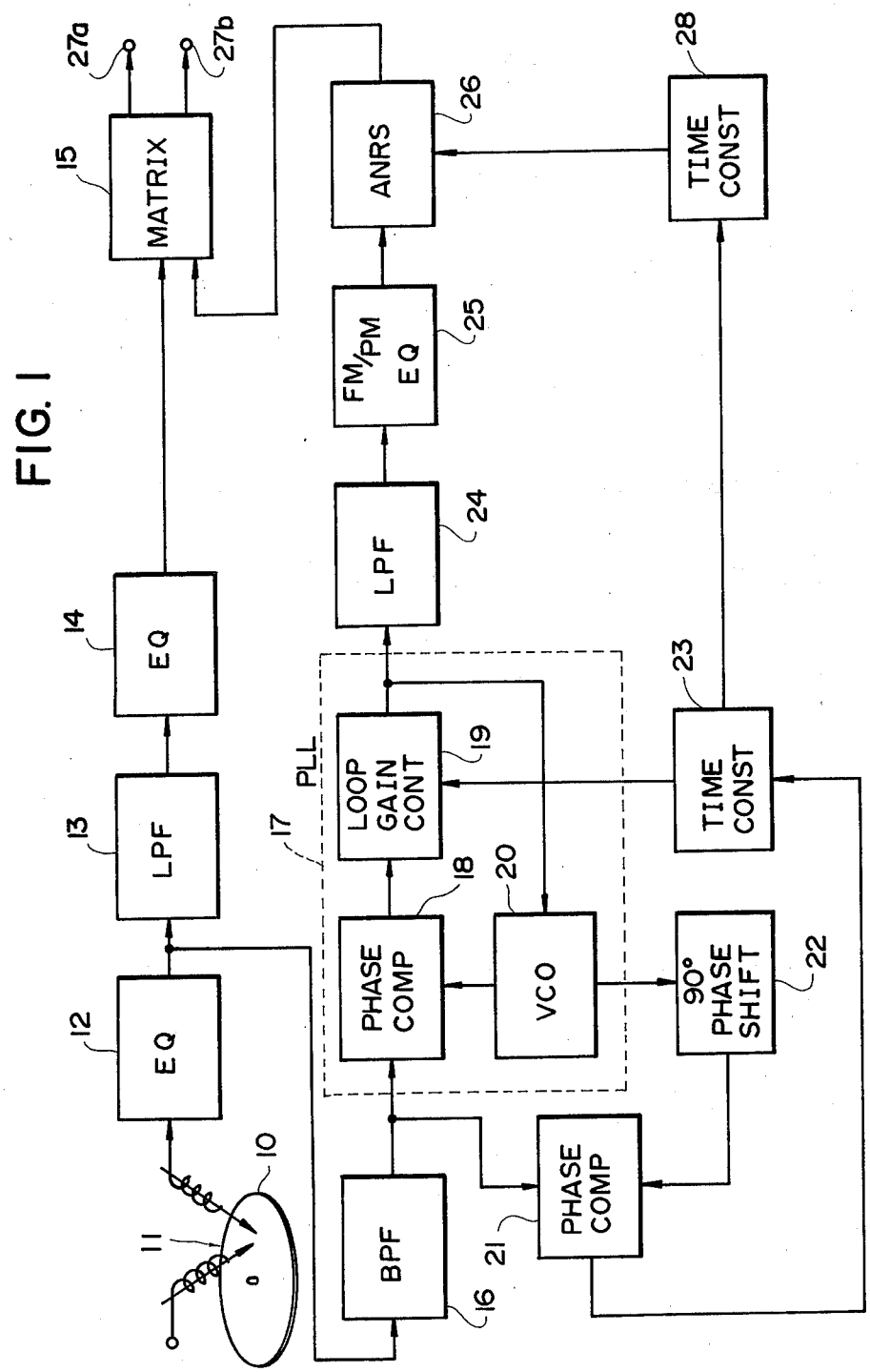
FIG. 1 is a block diagram showing the essential organization of one embodiment of a multichannel record disc reproducing system, according to the invention.

Referring now to FIG. 1, it will be seen that a multiplexed signal comprising a direct wave sum signal and an angle-modulated difference signal derived from each pair of two channels is recorded on each side wall of the sound groove of a four-channel record disc 10, thereby recording the signals for a total of four channels. A multiplexed signal of the direct wave sum signal and the angle-modulated wave difference signal, for the two-channel signal picked up from the left wall of the grooves of the disc 10 by a pickup cartridge 11, is fed to an equalizer 12 with a turnover RIAA characteristic for equalization.

The resultant signal is fed to a low-pass filter 13 for elimination of the angle-modulated wave component and for deriving the direct wave sum signal component only. The direct wave sum signal is fed to a matrix circuit 15 via an equalizer 14 having the roll-off RIAA characteristic.

The output of the equalizer 12 is partly fed to a bandpass filter 16 (or high-pass filter) with a passband in the approximate range of from 20 KHz to 45 KHz. An angle-modulated wave difference signal is derived from this filter. For demodulation, angle-modulated wave difference signal is fed to a phase locked loop (PLL) circuit 17 containing a phase comparator 18, a loop gain control circuit 19 and a voltage-controlled oscillator 20, etc.

The demodulated output from the PLL circuit 17 is supplied to a low-pass filter 24. The unwanted components contained in the output are eliminated thereat. The output from the low-pass filter 24 is fed in succession to the matrix circuit 15, FM/PM equalizer 25, and an automatic noise reduction system (ANRS) circuit 26 comprising an expandor. This succession of circuits presents a characteristic which compensates for the characteristic of a compressor in the recording system.

In the matrix circuit 15, the direct wave sum signal from the equalizer 14 and the demodulated difference signal from the ANRS circuit 26 are matrixed. From output terminals 27a and 27b are derived, for instance, the left front (the first channel) and the left rear (the second channel) signals, respectively.

The signal which has passed through the band-pass filter 16 is supplied, on the one hand, to the phase comparator 18 of the PLL 17 as described above, and, on the other hand, also to a phase comparator 21. Furthermore, the output signal of the voltage controlled oscillator 20 is phase shifted by a 90° phase shifter 22 and then is supplied to the above mentioned phase comparator 21. This phase comparator 21 acts as a synchronous detector and carries out phase comparison of the signal from the band-pass filter 16 and the signal from the 90° phase shifter 22. Comparator 21 produces an output voltage corresponding to the phase difference.

The output signal of the voltage controlled oscillator 20 of the PLL 17 and the input signal of the PLL 17 always have a phase difference of 90°, during the time when the PLL 17 is carrying out normal demodulation, with the input signal locked. Accordingly, the output signal of the 90° phase shifter 22 and the input signal of the PLL 17 have a phase relationship wherein they are of the same phase (or 180° opposite phase). The above mentioned phase comparator 21 constitutes the synchrnous detector. It compares the phases of the two above mentioned signals from oscillator 20 and PLL 17 to determine the extent to which the two are of the same phase (or opposite phase), and produces an output voltage in accordance with the result.

The relationship between the value of this output voltage, at this time, and the phases of the above mentioned two signals can be selected at will. For example, this relationship can be selected so that, when the signal from the band-pass filter 16 and the signal from the 90° phase shifter 22 are of opposite phase (i.e., the phase difference is 180°, the output of the phase comparator 21 becomes a voltage of approximately zero volts. When the phase difference between the two signals departs from 180°, or becomes less than or greater than 180 °, this output becomes a positive voltage, corresponding to this departure of the phase difference.

The synchronous detector uses the phase comparator 21. It is possible to detect not only a deviation of the angle-modulated wave component to a low-frequency, but also to detect a deviation thereof to a high frequency, as a resultant effect, because of the existence of the noise component. Furthermore, the synchronous detector affords a good dynamic characteristic. Discrimination between the noise component and the signal component is clear and accurate.

Instead of the phase comparator 21 used in the instant example, a low-deviation detection circuit may be used. Furthermore, while the output of the voltage controlled oscillator 20 is used as one of the signals, a signal obtained from the demodulated output of the PLL 17 may be used. In this case, when the angle-modulated wave deviates to a low frequency, the demodulated output of the PLL 17 is, of course, a signal corresponding to this deviation.

The output signal of the phase comparator 21 is supplied to the time constant circuit 23 and is there caused to have a suitable time constant. The output signal of the time-constant circuit 23 is supplied, on the one hand, to the loop gain control circuit 19 in the PLL 17, to control the same. A variable resistance circuit may be used for the loop gain control circuit 19, for example, The resistance value is variably controlled by a signal from the time-constant circuit, thereby to decrease the loop gain of the PLL 17. As a result, the lock range of the PLL 17 becomes more narrow, whereby the PLL 17 no longer locks with the input signal, and so-called locking-out occurs.

The detection by the above mentioned synchronous detector and the resistance control of the loop gain control circuit 19 are accomplished instantaneously, in an ON-OFF manner at high speed. Abnormal noise of a rapidly changing intermittent character is averaged out in accordance with the frequency of control by the sense of hearing.

When the intervals between outlockings, due to abnormal phenomenon, become repeated periods having durations from hundreds of Hz to numbers of KHz, the demodulated output of the PLL circuit 17 assumes a tone burst waveform, wherein these periods are fundamental waves. In actual practice, however, the level of the high frequency band fluctuates as a result of the unique nature of the PLL circuit 17. As the overall energy, the fundamental wave component of the musical tone remains.

By attenuating the high frequency band component, and the middle frequency band component, to a certain extent, in accordance with the necessity at the time of lock range control, it is possible to reduce considerably the unnaturalness of the tone, to the sense of hearing.

The output signal of the time-constant circuit 23 is supplied to a time-constant circuit 28. It imparts a specific time-constant thereto. The resulting signal is then supplied to the above mentioned ANRS circuit 26 to stop the variable expansion control operation thereof. In this connection, this ANRS circuit 26 corresponds to an expansion circuit in a compression and expansion system. At ordinary times, it is not controlled by a signal from the time-constant circuit 28; rather it exhibits complementary characteristics with a compression circuit provided in a multichannel record disc recording system.

Figure 2:
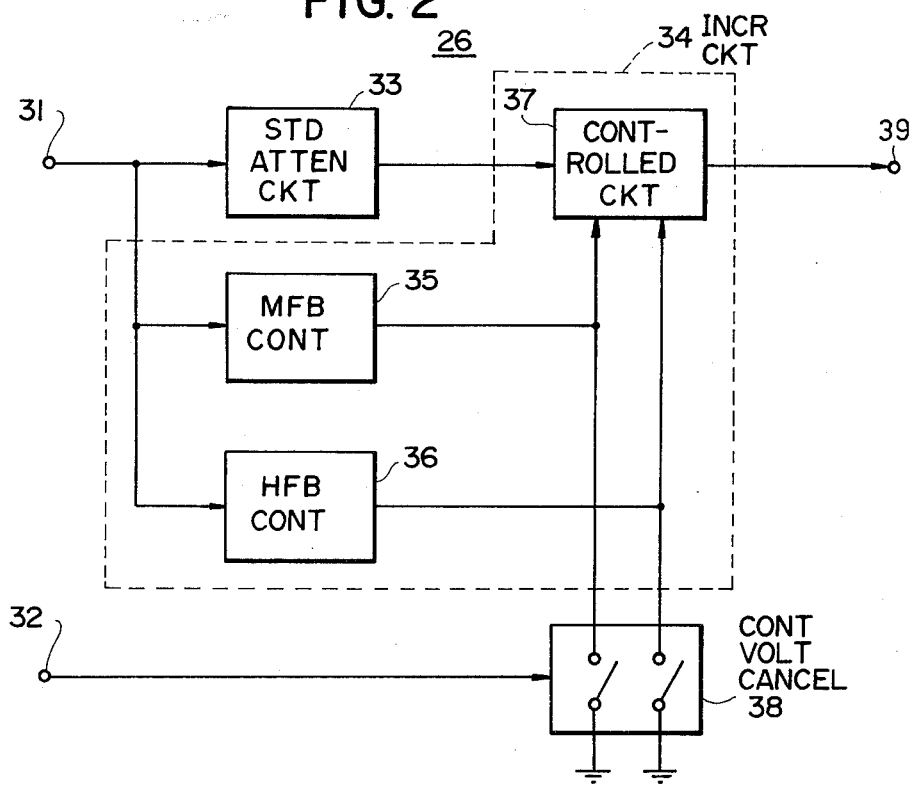
FIG. 2 is a block diagram showing the essential organization of one embodiment of an automatic noise reduction system (ANRS) circuit in the system illustrated in FIG. 1.

One embodiment of this ANRS circuit 26 is shown by a block diagram in FIG. 2. A demodulated difference signal, of a characteristic indicated by the curve a in FIG. 3(A), arrives from the aforementioned FM/PM equalizer 25 through an input terminal 31 and is supplied to a standard attenuation circuit 33, a middle frequency band control circuit 35, and a high frequency band control circuit 36. The standard attenuation circuit 33 has an attenuation characteristic, as indicated by the curves $b$ and $c$ in FIG. 3(B). It has an overall attenuation characteristic, as indicated by the curve $d$. This curve $d$ indicates attenuation quantities, for example, of −10dB at 630 Hz, −12dB at 2 KHz, and −15 dB at 15 KHz. The demodulated difference signal is fed to a controlled circuit 37. The difference signal has been attenuated with an attenuation characteristic, as indicated by curve $d$, by the standard attenuation circuit 33.

The above mentioned middle frequency band control circuit 35, high frequency band control circuit 36, and controlled circuit 37 constitute an increasing circuit 34. The increasing quantity of the middle frequency band of the controlled circuit 37 is controlled responsive to the output control voltage of the middle frequency band control circuit 35, as indicated by the curve $e$ in FIG. 3(B). The increasing quantity of the high frequency band of the controlled circuit 37 is controlled responsive to the output control voltage of the high frequency band control circuit 36, as indicated by the curve $f$ in FIG. 3(B). Accordingly, the controlled circuit 37 exhibits an increasing characteristic, as indicated by the curves $e$ and $f$, when the level of the input demodulated difference signal is high. This characteristic does not rise, but becomes flat and level as the level of the input demodulated difference signal becomes low. The curves $b$ and $e$ are complementary, and the curves $c$ and $f$ are complementary in the above mentioned case, where the level of the input signal is high.

A signal applied to an input terminal 32 from the time-constant circuit 28 is fed to a control voltage canceling circuit 38. Circuit 38 comprises switching circuits and operates upon receiving a signal through the input terminal 32. Circuit 38 grounds the output side of the middle frequency band control circuit 35 and (or) the high frequency band control circuit 36, and cancels the output control voltage thereof.

The control voltage canceling circuit 38 may alternatively be adapted always to cancel simultaneously the output control voltages of the middle frequency band and high frequency band control circuits 35 and 36 when arriving through the terminal 32 is applied thereto. Furthermore, this circuit 38 may also concal only the output control voltage of the middle frequency band control at the time when the signal received through the terminal 32 is of a medium level, and to cancel the output control voltages of the middle frequency band and high frequency band control circuits 35 and 36 when this level is high. In addition, this control voltage canceling may depend on the kind of the noise component to be supressed. Only the output control voltage of the high frequency band control circuit 36 will be canceled at the time when the signal received through the terminal 32 is, for example, of a medium level.

Figure 3:
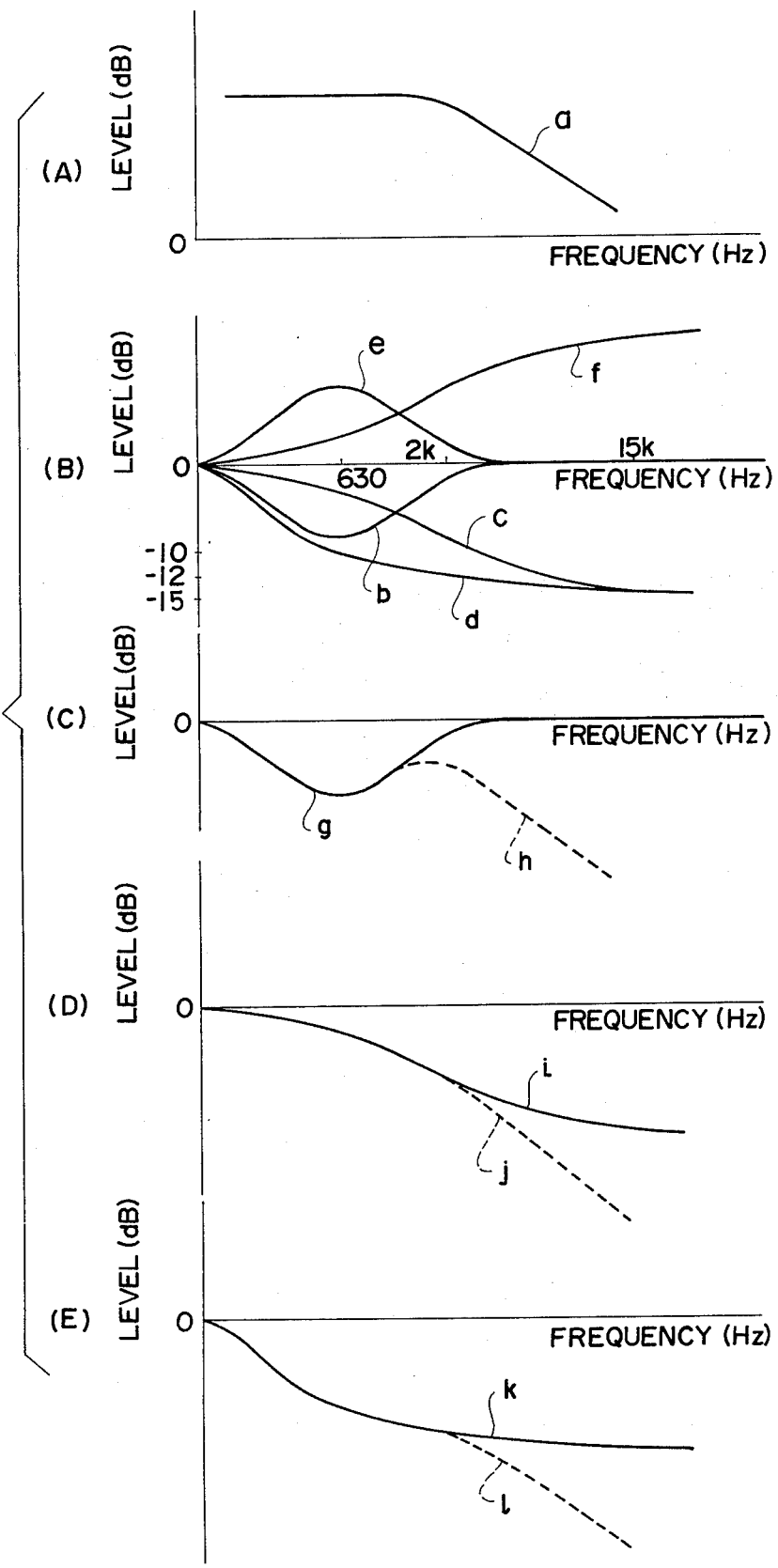
FIGS. 3(A) through 3(E) are graphs respectively indicating the frequency characteristics of the output signal of the automatic noise reduction circuit shown in FIG. 2.

If the output control voltage of the middle frequency band control circuit 35 has been canceled by the control voltage canceling circuit 38, the increasing characteristic of the controlled circuit 37 is as indicated by the curve $f$ in FIG. 3(B). Consequently, the signal obtained from an output terminal 39 through the standard attenuation circuit 33 and the controlled circuit 37 assumes a characteristic as indicated by curve $g$ in FIG. 3(C), as an overall resultant of the characteristics indicated by curves $b$, $c$, and $f$ in FIG. 3(B). Accordingly, the attenuation characteristic with respect to the maximum level of the signal $a$ indicated in FIG. 3(A) becomes as indicated by the intermittent-line curve $h$ in FIG. 3(C), when the attenuation of the signal $a$ in the high frequency band is considered. Here, the curve $g$ is substantially equal to the curve $b$.

Furthermore, if the output control voltage of the high frequency band control circuit 36 is canceled by the control voltage canceling circuit 38, the increasing characteristic of the controlled circuit 37 becomes only that indicated by curve $e$ in FIG. 3(B). Consequently, the signal passing through the standard attenuation circuit 33 and the controlled circuit 37 assumes a characteristic as indicated by curve $i$ in FIG. 3(D). Curve $i$ is an overall resultant of the characteristics indicated by curves $b$, $c$, and $e$ in FIG. 3(B). Accordingly, with respect to the maximum level of the input signal $a$, the attenuation characteristic becomes as indicated by curve $j$ in FIG. 3(D). Here, the curve $i$ is substantially equal to the curve $c$.

Furthermore, if the output control voltages of the middle frequency band and high frequency band control circuits 35 and 36 are canceled by the control voltage canceling circuit 38, the increasing characteristic of the controlled circuit 37 disappears. Consequently, the signal passing through the standard attenuation circuit 33 and the controlled circuit 37 assumes a characteristic as indicated by curve $k$ in FIG. 3(E), as an overall resultant of the characteristics indicated by curves $b$ and $c$ in FIG. 3(B). Accordingly, with respect to the maximum level of the input signal $a$, the attenuation characteristic becomes as indicated by curve $l$ in FIG. 3(E). Here, the curve $k$ is substantially equal to the curve $d$.

Accordingly, the noise due to the repeated occurence of lock-in and lock-out of the above described PLL 17 is effectively suppressed.

It is desirable for the above mentioned time-constant circuit 23 to have a time constant in which the attack time is less than 33 microseconds and the recovery time is of the order of 10 times the attack time. Furthermore, it is desirable for both the attack time and the recovery time of the time-constant circuit 28 to have relatively large time constants. Especially when the recovery time is selected at a value of, for example, from 3 to 5 milliseconds or more, it is possible always to cancel the above mentioned control voltage even with respect to a continuous, abnormal phenomenon.

Figure 4:
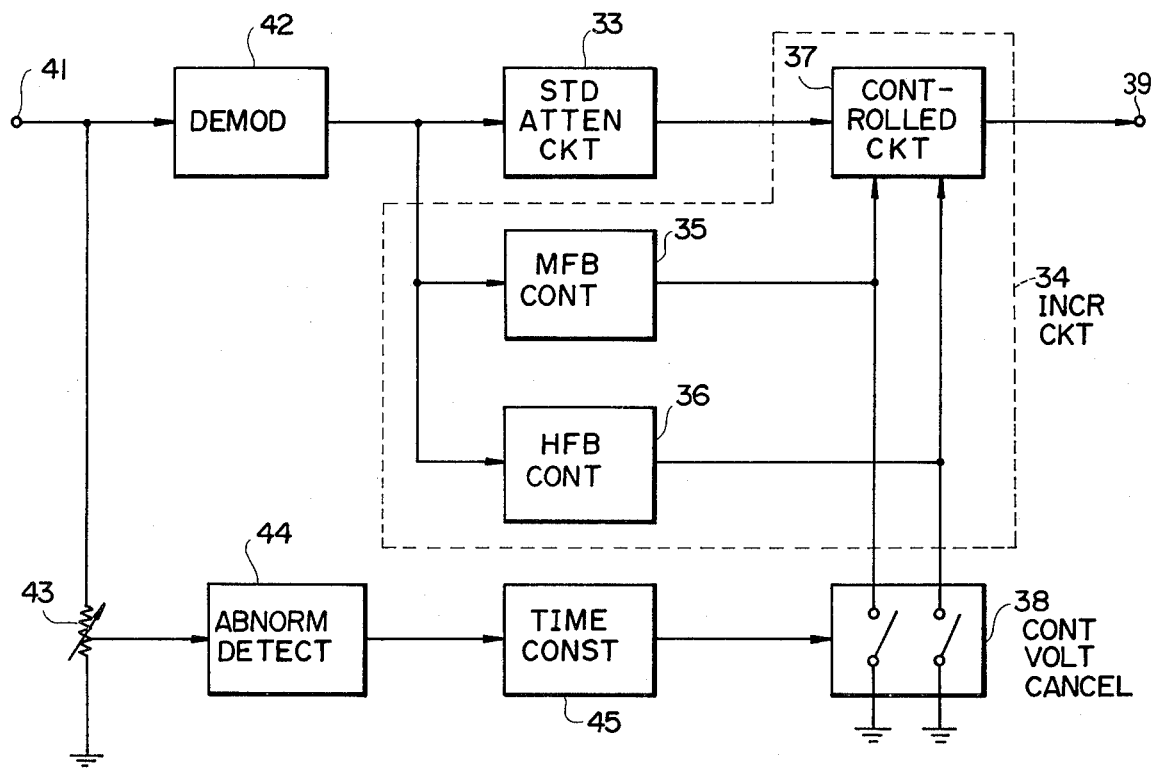
FIG. 4 is a block diagram showing the essential organization of another embodiment of the multichannel record disc reproducing system according to the invention.

Next, a second embodiment of the system of the present invention will be described with reference to FIG. 4. Those parts which are the same as corresponding parts in FIG. 2 are designated by like reference numerals. A detailed description of such parts will not be repeated.

An angle-modulated wave difference signal from the aforedescribed band-pass filter 16 shown in FIG. 1 is introduced into the system through an input terminal 41. The difference signal is demodulated by a demodulator 42 comprising, for example, a PLL. The output demodulated difference signal of the demodulator 42 is supplied to the standard attenuation circuit 33 and the increasing circuit 34.

The angle-modulated wave difference signal introduced through the input terminal 41 is also supplied by way of a variable resistor 43 to an abnormal phenomenon detecting circuit 44, consisting of a carrier level detection circuit, for example. When the input signal has an abnormal phenomenon, such as a carrier drop in the angle modulated wave difference signal introduced as input, it is quickly detected by the detecting circuit 44, which thereupon produces a detection output signal. This output signal is given a specific time constant by a time-constant circuit 45, and is then supplied to a control voltage canceling circuit 38. The output control voltages (or voltage) of a middle frequency band control circuit 35 and (or) a high frequency band control circuit 36 are canceled, similarly as described above with respect to the preceding embodiment.

The operation of the increasing circuit 34 and the characteristic of the signal passing through the standard attenuation circuit 33 and the increasing circuit 34 are substantially the same as those in the above described preceding embodiment. Therefore, they will not be described again.

If this circuit is combined with another noise removing circuit, the attack time of the time constant of the time-constant circuit 45 can be larger than the time constant of this combined circuit. If this circuit is used independently, it is necessary to select a small time constant. For example, it is selected at a value less than 100 microseconds, preferably 33 microseconds. Furthermore, it is desirable that the recovery time of the time constant of the time-constant circuit 45 have a value of from 3 to 5 milliseconds or more in order to sustain the canceling of the control voltage with respect to continuous repetitions in the range of hundreds of Hz to of KHz, of an abnormal sound signal.

It is to be understood, of course, that the present invention is not to be limited by the specific particulars of the above described embodiments. For example, instead of using the synchronous detector constituting of the phase comparator 21 in the system illustrated in FIG. 1, the abnormal phenomenon detecting circuit 44 in the system shown in FIG. 4 may be used to produce an output to control the loop gain of the PLL 17 and, at the same time, to control the ANRS circuit 26.

Figure 5:
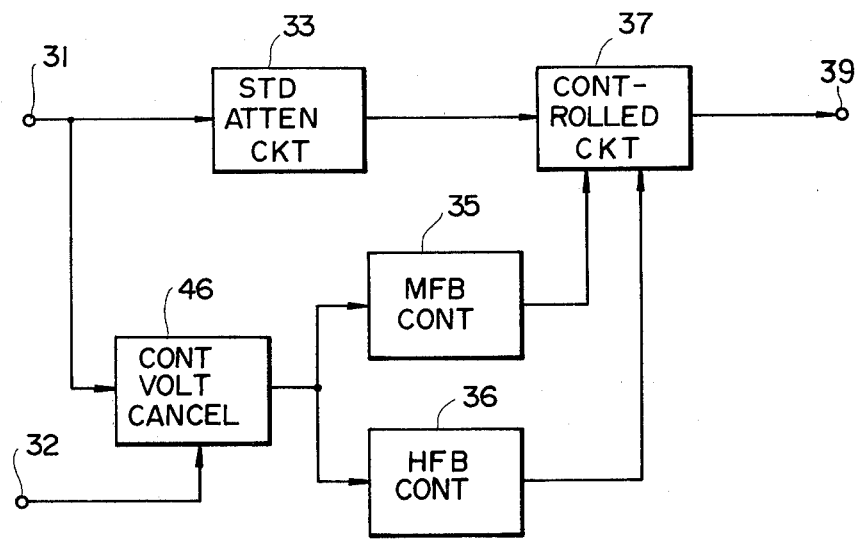
FIG. 5 is a block diagram showing an embodiment of modification of the ANRS circuit shown in FIG. 2.

A modification of the automatic noise reduction system (ANRS) circuit shown in FIG. 2 will now be described with reference to FIG. 5. In FIG. 5, parts which are the same as corresponding parts in FIG. 2 are designated by like reference numerals.

A signal introduced through the input terminal 31 from the FM/PM equalizer 25 is supplied to the standard attenuation circuit 33 and a control voltage canceling circuit 46. This control voltage canceling circuit 46 comprises a control amplifier and a bias circuit operating in response to a signal from the terminal 32 to change the bias of this control amplifier. When a signal enters through the terminal 32, the above mentioned control amplifier virtually ceases its amplification operation, it bias being changed, and cuts off the signal supplied from the terminal 31 to the middle-frequency band control circuit 35 and the high-frequency band control circuit 36. Other features and details of the circuit operation are similar to those of the circuit illustrated in FIG. 2 and will not be described again.

Figure 6:
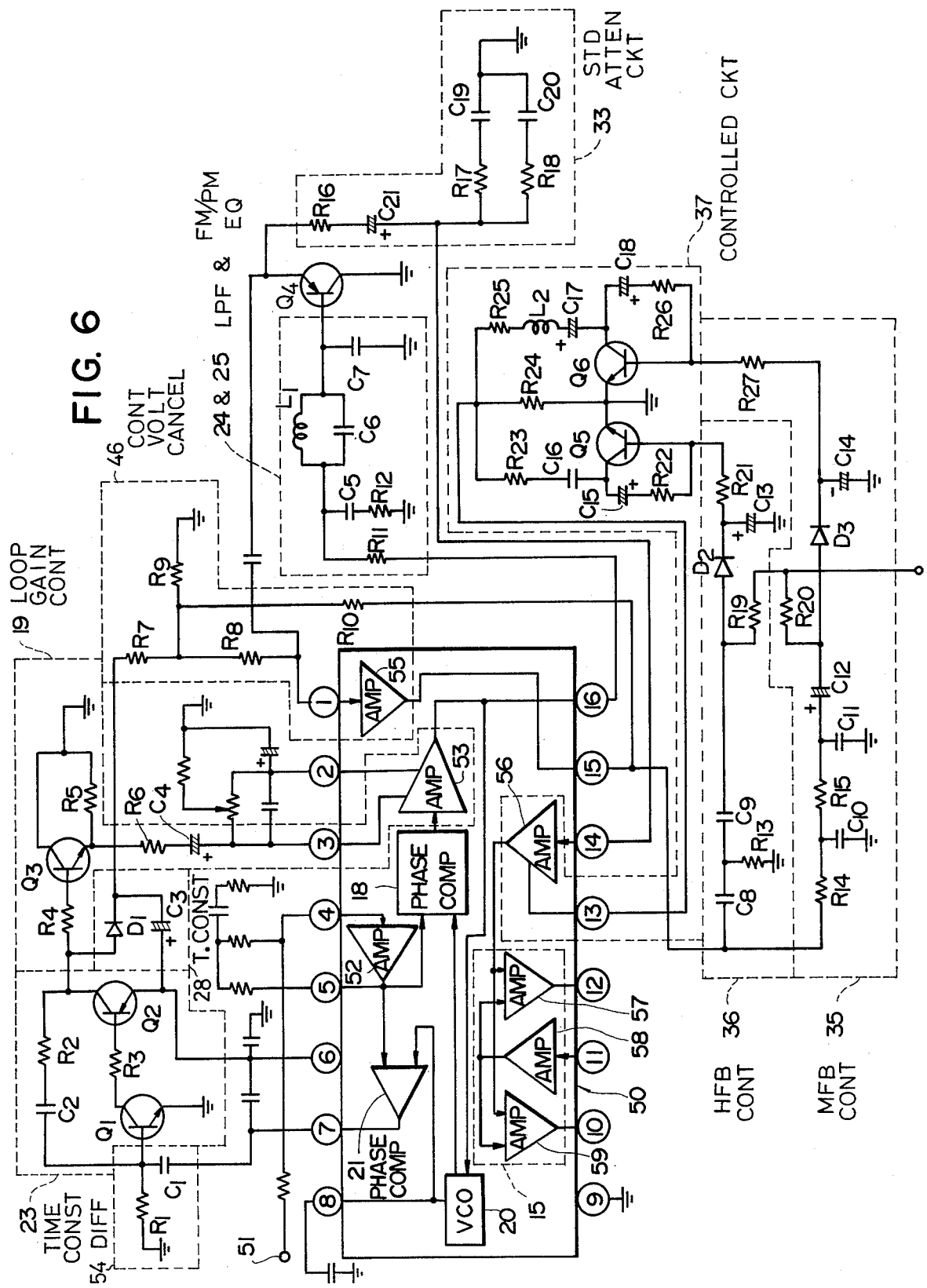
FIG. 6 is a circuit diagram showing one specific embodiment of a circuit in concrete form of an essential part of the system shown in FIGS. 1 and 5.

A specific embodiment of a circuit in concrete form of an essential part of the system shown in FIGS. 1 and 5 will now be described with reference to FIG. 6. In FIG. 6, parts which are the same as corresponding parts in FIGS. 1 and 2 are enclosed by intermittent line and are designated by like reference numerals.

The angle-modulated wave difference signal from the band-pass filter 16 is introduced through an input terminal 51 and supplied to the fourth pin of an integrated circuit 50, in which it is supplied by way of a limiting amplifier 52 to the phase comparator 18 and the phase comparator 21. This angle-modulated wave signal is demodulated by a PLL circuit comprising the phase comparator 18, a variable-gain amplifier 53, and the VCO 20. From the output side of the amplifier 53, a demodulated difference signal is led out through the 16th pin and supplied to the low-pass filter 24 comprising resistors R11 and R12, capacitors C5, C6, and C7, and a coil L1 and to the FM/PM equalizer 25.

On the other hand, a signal led out of a point in the VCO 20 of a phase differing by 90° relative to the phase of the signal from the VCO 20 to the phase comparator 18 is fed to the phase comparator 21, which produces an output led out through the seventh pin and supplied to a differentiation circuit 54 comprising a capacitor C1 and a resistor R1.

Figure 7:
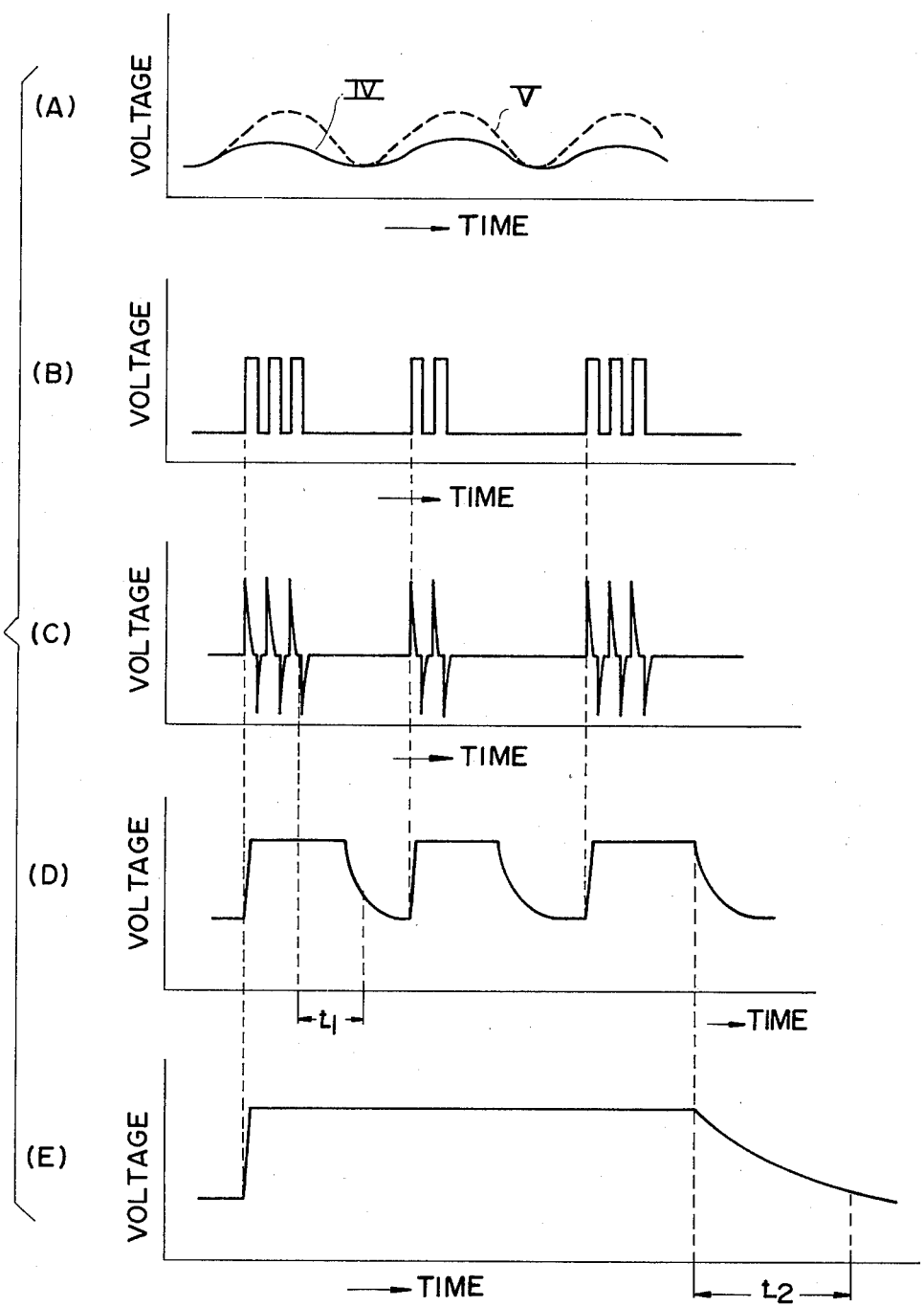
FIGS. 7(A) through 7(E) are respectively waveform graphs for a description of the operations of one portion of the circuit shown in FIG. 5.

This signal led out through the seventh pin is a normal-state modulated signal as indicated by full-line curve IV or broken-line curve V in FIG. 7(A) when the above mentioned PLL circuit is operating normally. Here, the deviation frequency of the modulated signal indicated by the broken line V is substantially equal to the maximum deviation frequency of the lock range of the PLL circuit. However, when the PLL circuit undergoes unlocking because of the occurrance of an abnormal phenomenon, the signal led out through the seventh pin becomes a signal of a pulse-like waveform containing many high-frequency band components as indicated in FIG. 7(B). This pulse signal is differentiated by the differentiation circuit 54 and rendered into a signal as indicated in FIG. 7(C).

Then, in the case where a normal-state modulated signal of large frequency deviation approaching the maximum frequency deviation of the lock range characteristic of the PLL circuit is introduced into this PLL circuit, the phase comparator 21 sends out as output a detection signal similarly as at the time of unlocking. In this case, however, the output of the phase comparator 21 is a signal of a waveform as indicated in FIG. 7(A), which can be positively distinguished by the presence of the differentiation circuit 54 from the output waveform indicated in FIG. 7(B) at the time of unlocking.

The output pulse of the differentiation circuit 54 as indicated in FIG. 7(C) is applied to the base of a transistor Q1 of the time constant circuit 23. This time constant circuit 23 comprises transistors Q1 and Q2, resistors R2 and R3, and a capicitor C2. The NPN transistor Q1 is caused to become "ON" by the positive polarity pulse within the output of the differentiation circuit 52. Consequently, the PNP transistor Q2 also becomes "ON" , and from its collector a signal of a waveform as indicated in FIG. 7(D) is led out.

The collector output of the transistor Q2 of the time constant circuit 23 is being positively fed back by way of the resistor R2 and the capacitor C2 to the base of the transistor Q1. For this reason, the transistor Q2 immediately becomes "ON" in response even to an input of very small pulse width from the differentiation circuit 52. This "ON" state of the transistor Q2 is sustained for a specific time $t1$ determined by the components such as the capacitor even after the pulse signal disappears, as is apparent from the waveform of the output signal of the time constant circuit 23 indicated in FIG. 7(D). Here, the attack time (the time from the introduction of the pulse signal to the instant when the transistors Q1 and Q2 become "ON" ; the rising time) is selected at a value of the order of, for example, 33 micro-seconds, while the recovery time (the time t1 from the disappearance of the pulse signal to the instant when the transistors Q1 and Q2 become "OFF"; falling time) is selected at a value of the order of, for example, 330 micro-seconds.

The output signal of the time constant circuit 23 is applied, on one hand, to the base of a transistor Q3 of the loop gain control circuit 19 comprising the transistor Q3, resistors R4, R5, and R6, a capacitor C4, and the variable gain amplifier 53 and, on the other hand, to the anode of a diode D1 of the time constant circuit 28 comprising a capacitor C3 and the diode D1.

Figure 8:
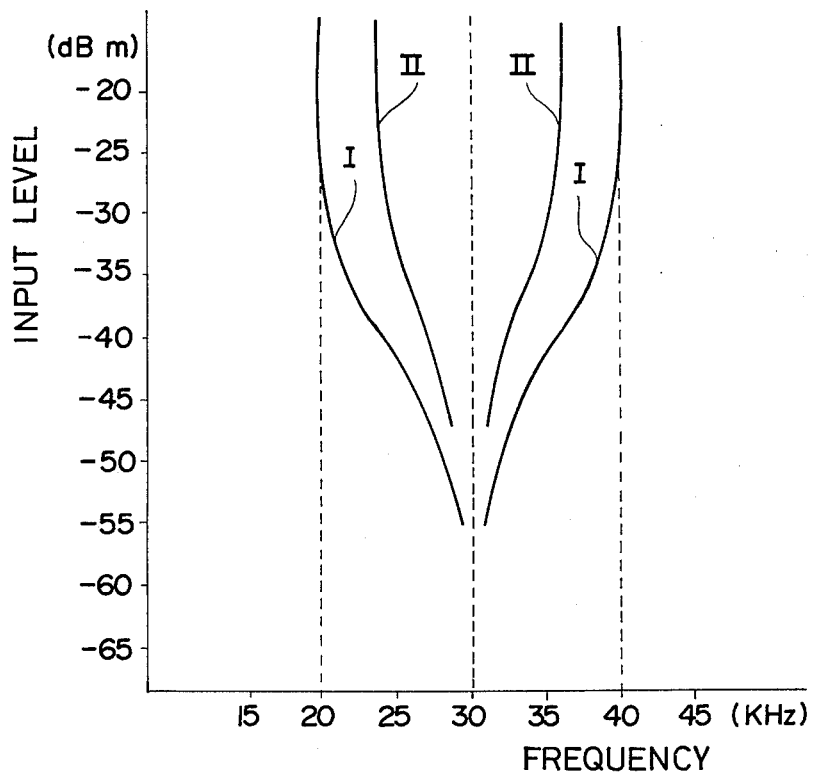
FIG. 8 is a graph indicating the lock range characteristics of a phase locked loop.

In the control circuit 19, when the signal as indicated in FIG. 7(D) is applied to the transistor Q3, this transistor Q3 assumes its conductive state, and the two terminals of the resistor R5 are short circuited, and the resistance value of the control circuit 19 is determined substantially by only the resistance value of the resistor R6 and becomes less than the resistance value at the time of normal reproduction, that is, the sum of the resistance values of the resistors R5 and R6. As a consequence, the gain of the variable gain control amplifier 53 is controlled, and the lock range of the PLL circuit becomes narrower from the normal range (30 KHz ± 10 KHz) indicated by curve I in FIG. 8, for example, to that (30 KHz, ± 7 KHz, for example) as indicated by curve II.

On the other hand, the signal as indicated in FIG. 7(D) supplied to the time constant circuit 28 is rendered into a signal having a time constant t2 as indicated in FIG. 7(E), which output signal is fed to the control voltage cancellation circuit 46. Here, the attack time (rising time) of the time constant circuit 28 is selected at, for example, 33 micro-seconds, and the recovery time (falling time; t2) at, for example, from 3 to 5 milli-seconds or more, and from 1 to 2 seconds in some cases.

The control voltage cancellation circuit 46 comprises a bias circuit comprising resistors R7, R8, R9, and R10 and a control amplifier 55 to which bias is applied by this bias circuit. When a signal as indicated in FIG. 7(E) is applied from the time constant circuit 28 to the bias circuit comprising the resistors R7 through R10 of the circuit 46, the bias point of the amplifier 55 is greatly varied from the normal bias point, and the gain of the amplifier 55 becomes virtually zero.

Here, in the case where there is no signal from the time constant circuit 28, the amplifier 55 carries out normal amplification operation, and a signal from the combined circuit of the above mentioned low-pass filter 24 and FM/PM equalizer 25 passes through a transistor Q4 for impedance conversion and the amplifier 55 and is led out through the 15th pin to be supplied respectively to the middle-frequency band control circuit 35 comprising resistors R14, R15, R20, and R27, capacitors C10, C11, C12, and C14, and a diode D3 and to the high-frequency band control circuit 36 comprising resistors R13, R19, and R21, capacitors C8, C9, and C13, and a diode D2. Of these components, the diodes D2 and D3 are for rectification, and the capacitors C13 and C14 are for smoothing.

Control signals obtained from the middle-frequency band control circuit 35 and the high-frequency band control circuit 36 are respectively applied to the bases of transistors Q6 and Q5 of the controlled circuit 37 comprising the transistors Q5 and Q6, resistors R22, R24, R25, and R26, capacitors C15, C16, C17, and C18, and a coil L2.

The signal from a circuit combined of the low-pass filter 24 and the FM/PM equalizer 25 passes through the transistor Q4 and the standard attenuation circuit 33 comprising resistors R16, R17, and R18 and capacitors C19, C20, and C21, where an attenuation characteristic as indicated by curve $d$ in FIG. 3(B) is imparted to this signal, which is then supplied through the 14th pin to an amplifier 56 within the integrated circuit 50.

To this amplifier 56, the above mentioned controlled circuit 37 is connected through the 13th pin. For this reason, when there are control signals from the control circuits 35 and 36, the controlled circuit 37 imparts increasing characteristics as indicated by curves $e$ and $f$ in FIG. 3(B) to the amplifier 56. Consequently, the output from the amplifier 56 acquires an overall characteristic of the attenuation characteristic of the attenuation circuit 33 and the increasing characteristic of the controlled circuit 37.

The output of the amplifier 56 is supplied to amplifiers 57 and 59 and is matrixed with a direct-wave sum signal supplied from the equalizer 14 through the 11th pin and by way of an amplifier 58. The matrix amplifiers 57, 58, and 59 form the matrix circuit 15. The signal which has thus been subjected to matrixing operation by the amplifiers 59 and 57 is thereby separated into a left-front (first) channel signal and a left-rear (second) channel signal. These signals are respectively led out through the 10th and 12th pins.

Then, when there is a signal from the time constant circuit 28, and the gain of the amplifier 55 becomes virtually zero, as described above, the signal supplied from the 15th pin to the control circuits 35 and 36 disappears. As a consequence, the controlled circuit 37 is no longer controlled and does not impart an increasing characteristic to the amplifier 56.

Further, this invention is not limited to these embodiments, but various variations and modifications may be made without departing from the scope and spirit of the invention.

What is claimed is:

1. A multichannel record disc reproducing system for reproducing a signal picked up from a multichannel record disc on which a multiplexed signal comprising a direct wave signal and a signal angle-modulated on a carrier wave is recorded, said reproducing system comprising:
   demodulation means for demodulating an angle-modulated wave signal from said picked up signal;
   detection means associated with said demodulating means and responsive to said carrier wave for detecting abnormality of the angle-modulated wave signal thus separated;
   expansion attenuation means responsive to the level of the demodulated output signal for variably controlling the expansion and attenuation in a middle frequency band and/or a high frequency band component in the demodulated output signal from the demodulation means; and
   stopping means responsive to the output of the detection means for at least partly stopping the variable expansion operation of the exapnsion means;
   said expansion means imparting a predetermined attenuation characteristic to the input signal applied to the expansion means when the variable expansion control operation thereof is thus stopped by the stopping means.

2. A multichannel record disc reproducing system as claimed in claim 1 in which the expansion means comprises circuit means for attenuating an input demodulated signal with a predetermined attenuation characteristic, voltage generating means for generating a control voltage responsive to the level of the input demodulated signal, and increasing control means responsive to the control voltage for increasing the level of a signal through the attenuation circuit, said stopping means comprising means for eliminating the output control voltage of the voltage generating means.

3. A multichannel record disc reproducing system as claimed in claim 2 in which the means for eliminating the output control voltage comprises grounding means responsive to the output of the detection means for grounding the output side of the voltage generating means.

4. A multichannel record disc reproducing system as claimed in claim 2 in which said voltage generating means comprises a first control voltage generating circuit for generating a first control voltage responsive to the level of a middle frequency band component of the input demodulated signal and a second control voltage generating circuit for generating a second control voltage responsive to the level of the high frequency band component of the input demodulated signal; said increasing control means is controlled of the characteristic for increasing the level of the signal with respect to the middle frequency band component of the input signal in response to the first control voltage and is controlled of the characteristic for increasing the level of the signal with respect to the high frequency band component of the input signal in response to the second control voltage; and said means for eliminating the output control voltage comprises means responsive to the level of the input demodulated signal for eliminating the output control voltage of the first control voltage generating circuit and/or the output control voltage of the second control voltage generating circuit.

5. A multichannel record disc reproducing system as claimed in claim 1 in which the demodulation means comprises a phase locked loop including a phase comparator means and a voltage controlled oscillator means; detection means comprising a synchronous detector means for comparing the phases of the angle-modulated wave signal and of the output signal of the voltage controlled oscillator, said synchronous detector means responsive to a departure from a normal phase difference between the two compared signals producing a voltage which varies according to the deviation of the compared phases from the normal phase difference, said phase locked loop further having control means operated by the output of the synchronous detector means to control the loop gain of the phase locked loop.

6. A multichannel record disc reproducing system as claimed in claim 1 which further comprises a time-constant circuit means for imparting a predetermined time constant to the output signal of the detection means and thereafter feeding the resulting signal to the stopping means.

7. A multichannel record disc reproducing system as claimed in claim 1 in which the detection means is a carrier level detecting circuit for detecting the carrier level of the angle-modulated wave and producing an output signal responsive to a drop in the level of the carrier.

8. A multichannel record disc reproducing system comprising:

demodulation means for demodulating an angle-modulated wave signal separated out of a signal picked up from a multichannel record disc on which a direct wave signal and an angle-modulated wave signal are recorded in a multiplexed state;

detection means for detecting abnormal phenomena which generate noises in the angle-modulated wave signal thus separated;

expansion means comprising means for imparting a predetermined attenuation characteristic to the input demodulated signal, and means for variably imparting an increasing characteristic to the input demodulated signal in accordance with the level of the output demodulated signal; and stopping means for stopping the imparting operation of the imparting means with respect to at least one part of the frequency band of the demodulated signal in response to the output of the detection means.

9. A multichannel record disc reproducing system as claimed in claim 8 in which the expansion means further comprises a control voltage generating means for generating a control voltage to control the increasing characteristic imparting means in accordance with the level of the input demodulated signal, and the stopping means comprises means for causing the output control voltage of the control voltage generating means to vanish.

10. A multichannel record disc reproducing system as claimed in claim 9 in which: the control voltage generating means comprises a first control voltage generating circuit for generating a first control voltage according to the level of the middle frequency band component of the input demodulated signal and a second control voltage generating circuit for generating a second control voltage according to the level of the high frequency band component of the input demodulated signal; the increasing characteristic of the increasing control circuit being taken with respect to the middle frequency band component of the input signal and controlled responsive to the first control voltage, while the increasing characteristic thereof is controlled with respect to the high frequency band component responsive to the second control voltage; and the means for causing the output control voltage to vanish comprises means operating in accordance with the level of the input demodulated signal to cause the output control voltage of the first control voltage generating circuit and/or the output control voltage of the second control voltage generating circuit to vanish.

11. A multichannel record disc reproducing system as claimed in claim 1 in which the demodulation means comprises a first phase comparator supplied with said separated angle-modulated wave signal, and a voltage-controlled oscillator operating at an oscillation frequency controlled in accordance with the resulting output of the first phase comparator and producing an output supplied to the input side of the first phase comparator; and the detection means comprises a second phase comparator supplied with the separated angle-modulated wave signal and a signal differing in phase by 90° from the signal from the voltage-controlled oscillator to the first phase comparator, and a differentiation circuit for differentiating the output signal of the second phase comparator.

* * * * *